US009886996B2

(12) United States Patent
Fujiwara et al.

(10) Patent No.: US 9,886,996 B2
(45) Date of Patent: Feb. 6, 2018

(54) SRAM CELL FOR INTERLEAVED WORDLINE SCHEME

(71) Applicant: Taiwan Semiconductor Manufacturing Co., Ltd., Hsin-Chu (TW)

(72) Inventors: Hidehiro Fujiwara, Hsin-Chu (TW); Hung-Jen Liao, Hsin-Chu (TW); Hsien-Yu Pan, Hsinchu (TW); Yen-Huei Chen, Jhudong Township (TW); Mahmut Sinangil, Sunnyvale, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/222,914

(22) Filed: Jul. 28, 2016

(65) Prior Publication Data

US 2017/0110181 A1   Apr. 20, 2017

Related U.S. Application Data

(60) Provisional application No. 62/243,225, filed on Oct. 19, 2015.

(51) Int. Cl.
*G11C 11/412* (2006.01)
*G11C 11/418* (2006.01)
(Continued)

(52) U.S. Cl.
CPC ............ *G11C 11/412* (2013.01); *G11C 8/14* (2013.01); *G11C 11/418* (2013.01); *G11C 11/419* (2013.01); *H01L 27/1104* (2013.01)

(58) Field of Classification Search
CPC .................... G11C 11/412; G11C 11/418
(Continued)

(56) References Cited

U.S. PATENT DOCUMENTS

| 7,092,279 B1 * | 8/2006 | Sheppard ............... G11C 7/02 |
| | | 257/E21.656 |
| 2002/0100920 A1 * | 8/2002 | Yamauchi ............... G11C 8/16 |
| | | 257/200 |

(Continued)

OTHER PUBLICATIONS

Fujiwara, et al. "A 20nm 0.6V 2.1µ W/MHz 128kb SRAM with no Half Select Issue by Interleave Wordline and Hierarxhical Bitline Scheme." 2013 Symposium on VLSI Circuits Digest of Technical Papers. Published in 2013.

*Primary Examiner* — Huan Hoang
*Assistant Examiner* — Muna A Techane
(74) *Attorney, Agent, or Firm* — Eschweiler & Potashnik, LLC

(57) ABSTRACT

In some embodiments, the present disclosure relates to a static random access memory (SRAM) device. The SRAM device includes a plurality of SRAM cells arranged in a plurality of rows and a plurality of columns, wherein respective SRAM cells include respective pairs of complementary data storage nodes to store respective data states. A first pair of access transistors is coupled to the complementary data storage nodes of an SRAM cell and is configured to selectively couple the complementary data storage nodes to a first pair of complementary bitlines, respectively. A second pair of access transistors is coupled to the complementary data storage nodes of the SRAM cell and is configured to selectively couple the complementary data storage nodes to a second pair of complementary bitlines, respectively.

20 Claims, 14 Drawing Sheets

(51) Int. Cl.
*H01L 27/11* (2006.01)
*G11C 11/419* (2006.01)
*G11C 8/14* (2006.01)

(58) Field of Classification Search
USPC .......................................................... 365/51
See application file for complete search history.

(56) References Cited

U.S. PATENT DOCUMENTS

| | | | | |
|---|---|---|---|---|
| 2005/0047256 | A1* | 3/2005 | Yang | G11C 8/16 365/230.05 |
| 2007/0002617 | A1* | 1/2007 | Houston | G11C 11/412 365/185.07 |
| 2013/0069112 | A1* | 3/2013 | Zhu | H01L 21/845 257/192 |
| 2013/0141963 | A1* | 6/2013 | Liaw | G11C 11/412 365/156 |

* cited by examiner

SRAM CELL FOR INTERLEAVED WORDLINE SCHEME

REFERENCE TO RELATED APPLICATION

This application claims priority to U.S. Provisional Application No. 62/243,225 filed on Oct. 19, 2015. The contents of which is hereby incorporated by reference in its entirety.

BACKGROUND

Semiconductor memory is an electronic data storage device implemented on a semiconductor-based integrated circuit. Semiconductor memory is made in many different types and technologies. Semiconductor memory has much faster access times than other types of data storage technologies. For example, a byte of data can often be written to or read from semiconductor memory within a few nanoseconds, while access times for rotating storage such as hard disks is in the range of milliseconds. For these reasons, among others, semiconductor memory is used as a primary storage mechanism for computer memory to hold data the computer is currently working on, among other uses.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A illustrates lower layers of the layout (e.g., fin, local interconnect, and gate layers), FIG. 3B illustrates lower and middle layers of the layout (e.g., fin, gate, local interconnect, contact, and metal 1 layers), FIG. 3C illustrates upper layers of the layout (e.g., metal 1, metal 2, and via 1 layers), and FIG. 3D illustrates the superposition of FIGS. 3A-3C.

DETAILED DESCRIPTION

Figure 1:
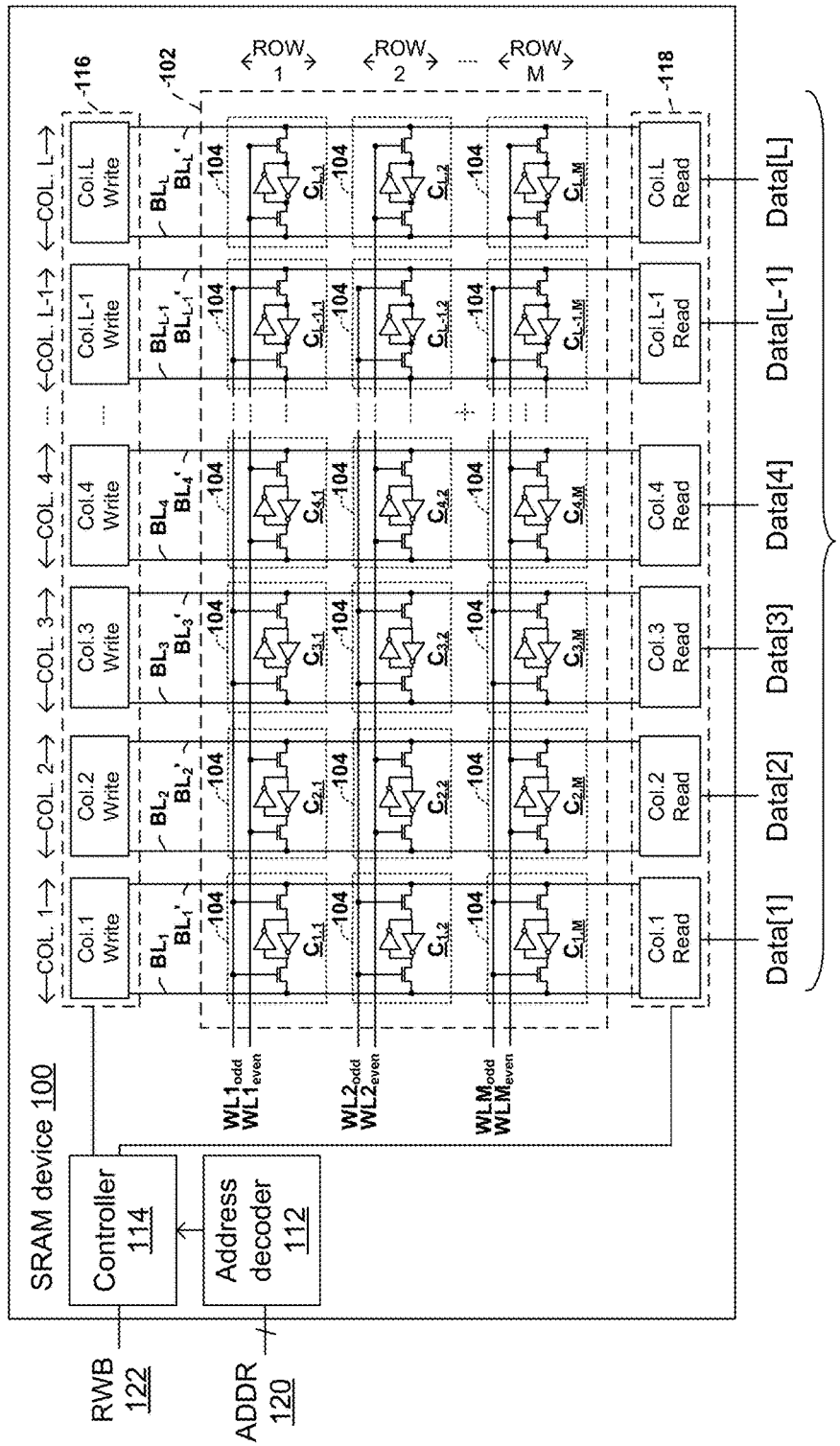
FIG. 1 illustrates a block diagram of a static random access memory (SRAM) device that uses interleaved wordlines according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a block diagram of a SRAM device 100 that makes use of so-called "interleaved" wordlines in accordance with some embodiments. The SRAM device 100 includes an array 102 made up of a number of SRAM cells 104 which are arranged in L columns and M rows, where L and M can be any integers and can be the same or different from one another. For clarity, the individual memory cells 104 are labeled as $C_{COLUMN-ROW}$ in FIG. 1.

Along each column, a pair of complementary bit lines can be coupled to respective memory cells of the entire column. For example, complementary bit lines $BL_1$, $BL_1'$ are coupled to each memory cell along Col. 1 (e.g., cells $C_{1,1}$ through $C_{1,N}$); complementary bit lines $BL_2$, $BL_2'$ are coupled to each memory cell along Col. 2 (e.g., cells $C_{2,1}$ through $C_{2,N}$); and so on. The bitlines are complementary in that one bit line in each pair carries a first voltage level corresponding to a logical "1" state, while the other bit line of the pair carries a second voltage level corresponding to a logical "0" state as data values are transferred during read and write operations.

Along each row, a pair of interleaved wordlines are coupled to even and odd columns of memory cells of the row in alternating fashion. For example, in Row 1, a pair of interleaved wordlines $WL1_{odd}$, $WL1_{even}$ are coupled to cells $C_{1,1}$-$C_{L,1}$. Thus, $WL1_{odd}$ can be coupled to memory cells of odd columns of Row 1 (e.g., memory cell $C_{1,1}$ of column 1; memory cell $C_{3,1}$ of column 3; . . . ; and memory cell $C_{L-1,1}$ of column L−1), while $WL1_{even}$ can be coupled to memory cells of even columns of Row 1 (e.g., memory cell $C_{2,1}$ of column 2; memory cell $C_{4,1}$ of column 4; . . . ; and memory cell $C_{L,1}$ of column L). Compared to traditional architectures where each wordline corresponds to a single row in a one-to-one manner, the interleaved wordlines of FIG. 1 can reduce signal propagation delay on the wordlines and can reduce the power needed for the bitlines.

For a write operation, the read/write signal (RWB 122) is provided to the memory device 100 in a first state (e.g., logical "0"), along with an address specified in the ADDR signal 120, and along with input data values 124. Upon receiving these signals, the address decoder 112 and controller 114 can collectively enable a pair of interleaved wordlines for a row that corresponds to the address specified in the ADDR signal 120. For example, if the ADDR signal corresponds to Row 1, $WL1_{odd}$ and $WL1_{even}$ can be concurrently asserted to access memory cells $C_{1,1}$-$C_{L,1}$, while the other wordline signals are disabled to ensure only $C_{1,1}$-$C_{L,1}$ are accessed for writing. The controller 114 can then enable write circuitry 116 to apply respective differential biases to respective complementary bit lines over the array to write the input data values 124 to the accessed memory cells at the specified address.

For a read operation, the read/write signal (RWB 122) is provided to the memory device 100 in a second state (e.g., logical "1"). The complementary bit lines are floated, often being pre-charged to a voltage level that is between a logical "0" state and a logical "1" state. The address decoder 112 and controller 114 then collectively enable a pair of interleaved wordlines for a row that correspond to the address specified in the ADDR signal 120. The accessed cells along the row then drive a differential bias onto their respective pairs of complementary bit lines, causing differential biases, which correspond to data states stored in the respective cells to be established on the respective complementary bit line pairs. For example, if cell $C_{1-1}$ stores a logical "1" value and $C_{2-1}$ stores a logical "0" value, concurrent assertion of wordlines $WL1_{even}$, $WL1_{odd}$ can lead to a first differential bias on $BL_1/BL_1'$ (corresponding to a logical "1" which can be detected by Col. 1 read circuit in 118) and can concurrently lead to a second, different differential bias on $BL_2/BL_2'$ (corresponding to a logical "0" which can be detected by Col. 2 read circuit in 118). The biased bit lines are then coupled to the read circuitry 118, which typically includes a sense amplifier for each column. After the sense amplifiers detect the respective differential biases, the sense amplifiers then latch the corresponding data values and deliver the read data to the memory interface as output data values 124.

As technology improves, feature sizes become smaller in such SRAM devices and operating voltages are reduced. Although the interleaved wordlines may help SRAM devices operate at lower operating voltages and smaller geometries in some regards, compared to traditional architectures where each wordline corresponds to a single row in a one-to-one manner, interleaved wordlines tend to increase the area of the SRAM cells. Therefore, to attempt to keep the areas of SRAM cells with interleaved wordlines relatively small, the present disclosure provides for improved layouts for such SRAM devices.

Figure 2:
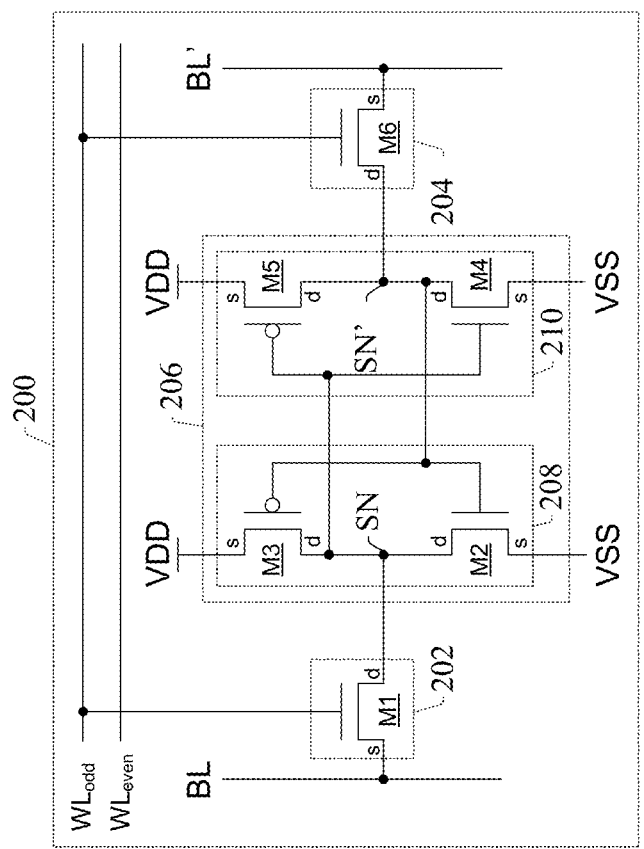
FIG. 2 illustrates a schematic diagram of a SRAM cell in accordance with some embodiments.

FIG. 2 shows a transistor schematic diagram of an individual SRAM cell 200 in accordance with some embodiments. The SRAM cell 200 includes first and second access transistors 202, 204 and a data storage element 206. The data storage element 206 is made up of a pair of cross coupled inverters 208, 210 that are arranged to establish first and second complementary storage nodes SN, SN'. The first and second access transistors 202, 204 have their respective sources coupled to the first and second storage nodes SN, SN', respectively, and have their respective drains coupled to first and second complementary bit lines BL, BL', respectively. Because the access transistors 202, 204 provide bi-directional current flow, it will be appreciated that the terms "source" and "drain" are somewhat arbitrary here and could be exchanged. Two interleaved wordlines $WL_{odd}$, $WL_{even}$ extend over the SRAM cell 200. In the illustrated embodiment, $WL_{odd}$ is coupled to the respective gate terminals of the access transistors 202, 204, such that wordline $WL_{odd}$ can be selectively asserted to selectively couple the first and second storage nodes SN, SN' to the first and second complementary bit lines BL, BL', respectively. $WL_{even}$ extends over the SRAM cell 200 without being coupled to the gates of the access transistors 202, 204. However, when the SRAM cell 200 is included as part of an SRAM array (see e.g., FIGS. 6-7 described further herein), $WL_{even}$ is likely coupled to gates of access transistors for neighboring SRAM cells (not shown in FIG. 2) to the left and right of the SRAM cell 200.

Figure 3A:
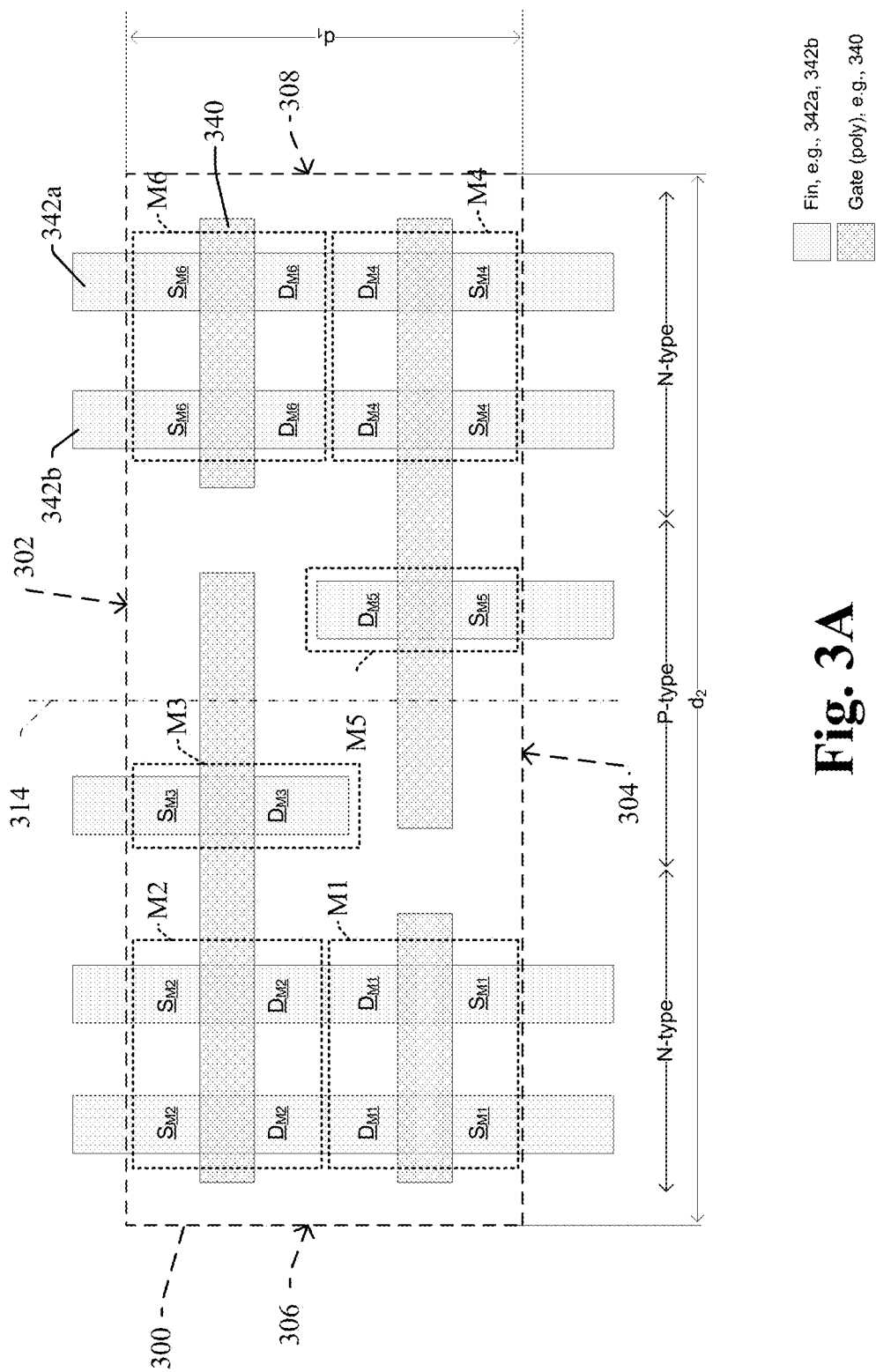
FIGS. 3A-3D illustrate some embodiments of a layout view of an SRAM cell having interleaved wordlines consistent with some examples of FIG. 2.
Figure 3B:
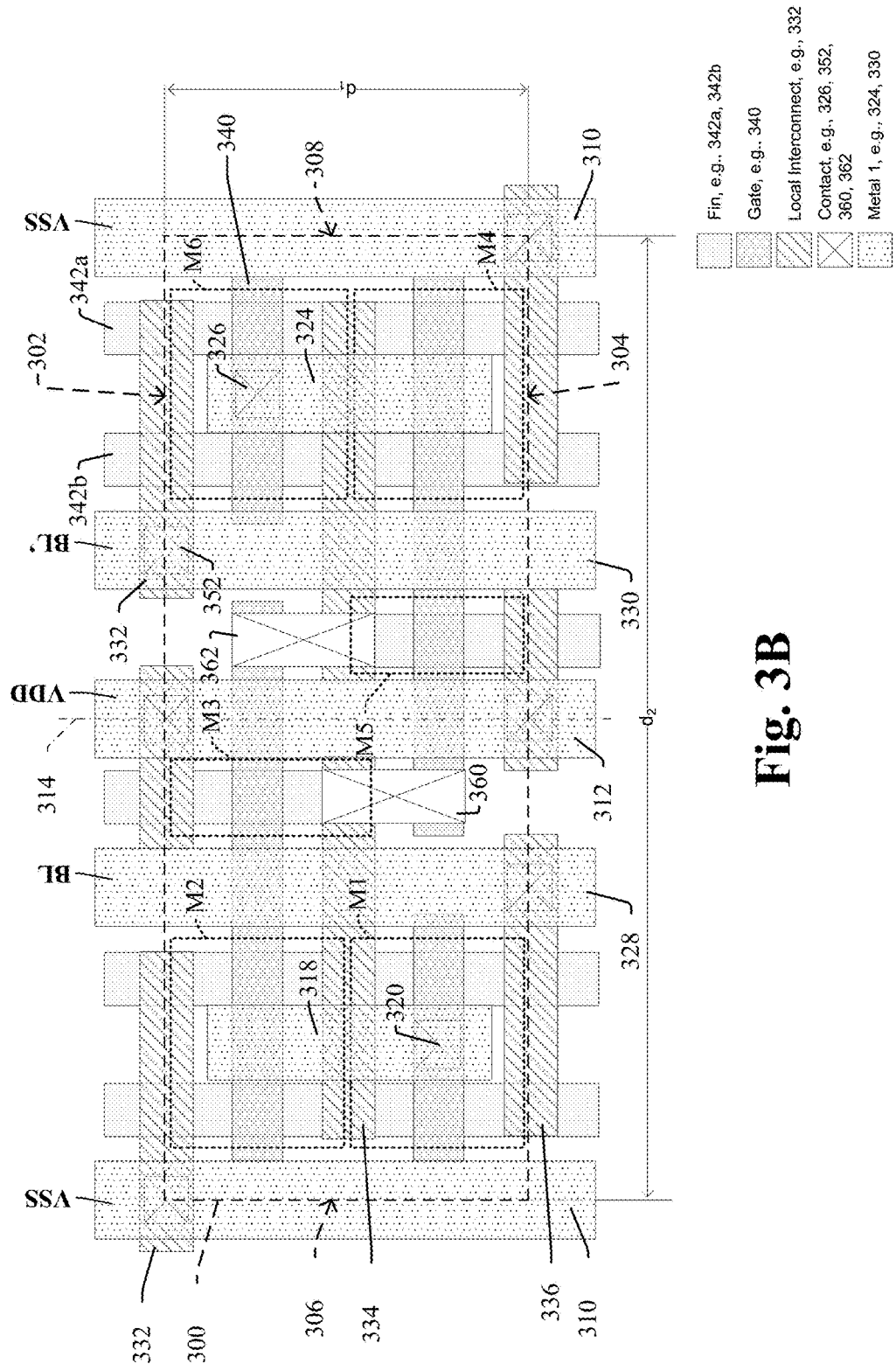
Figure 3C:
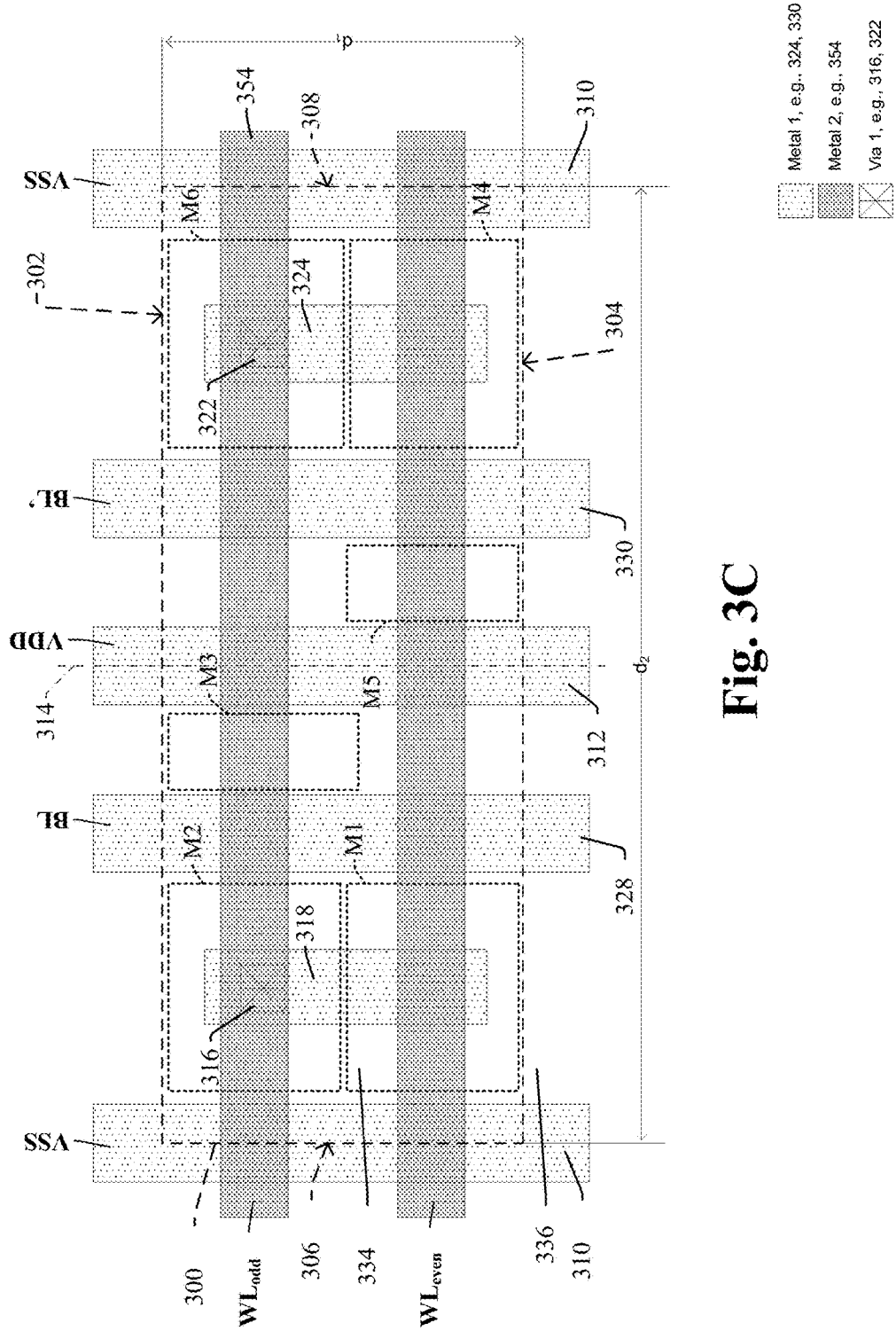
Figure 3D:
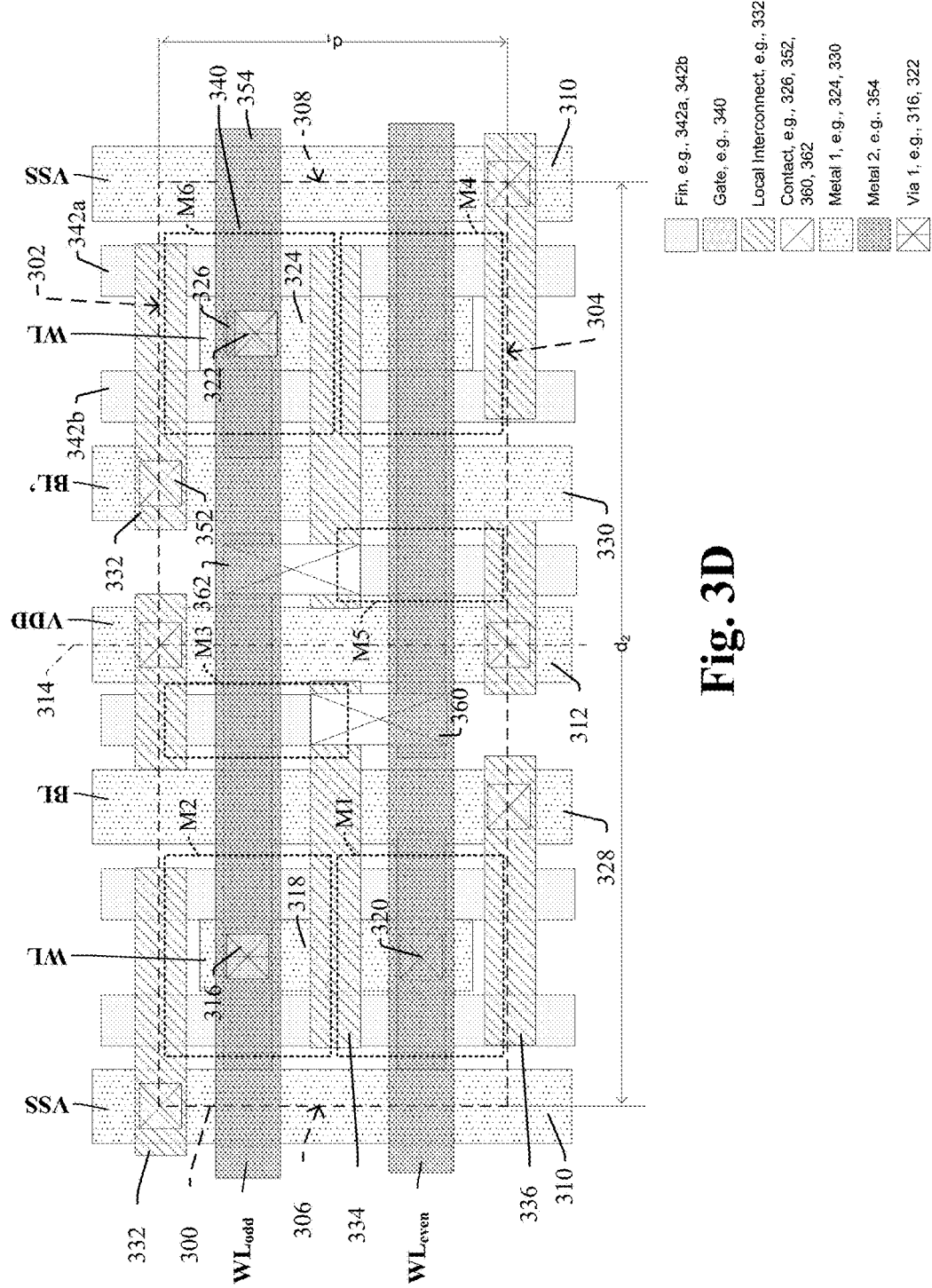

FIGS. 3A-3D illustrate some embodiments of an SRAM cell layout 300 consistent with FIG. 2's SRAM cell 200. FIG. 3A illustrates lower layers of the layout 300 (e.g., fins 342a, 342b; and gate 340 layers), FIG. 3B illustrates lower and middle layers of the layout 300 (e.g., fins 342a, 342b, gate 340, local interconnect 332, contacts 326, 352, and metal1 324, 330 layers), FIG. 3C illustrates upper layers of the layout (e.g., metal1 324, 330; metal2 354; and via 1 layer 322), and FIG. 3D illustrates the superposition of FIGS. 3A-3C. For clarity, in each of FIGS. 3A-3D the transistors of the SRAM cell layout 300 have been labeled as M1, M2, M3, M4, M5, and M6, and correspond to transistors M1, M2, M3, M4, M5, and M6, respectively, of FIG. 2's SRAM cell 200.

Figure 3E:
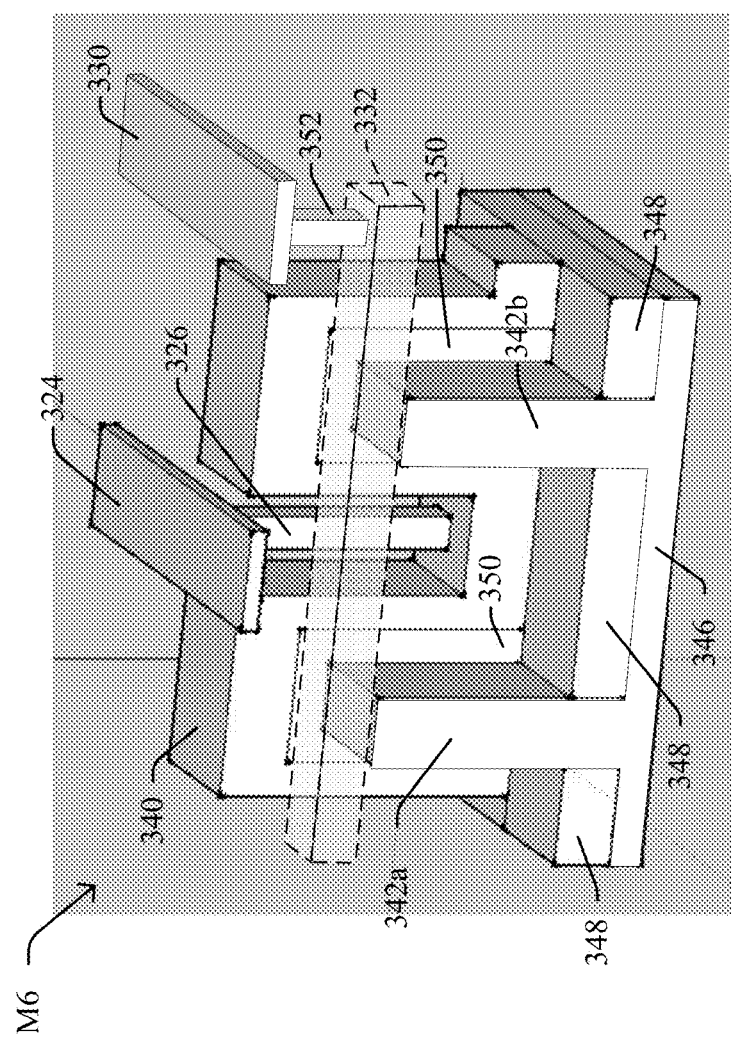
FIG. 3E illustrates some embodiments of a perspective view of an SRAM access transistor which is implemented as a FinFET in accordance with some embodiments.

Referring briefly to FIG. 3E (which shows a perspective view of FinFET M6, which includes two fins 342a, 342b corresponding to a portion of FIGS. 3A-3D), the gate layer 340 is stacked over the fins 342a, 342b and is separated from the fins 342a, 342b by a gate dielectric 350, while the local interconnect 332 extends over the fins 342a, 342b and is in direct ohmic contact with upper regions of the fins 342a, 342b. The metal1 layer 324, 330 is stacked over the gate layer 340 and over the local interconnect 332, and the metal2 layer (see FIGS. 3C-3D: 354; but not shown in FIG. 3E) is stacked over the metal1 layer 324, 330. Some contacts (326) couple the metal1 layer 324 to the gate layer 340 while other contacts (352) couple the metal1 layer 330 to the local interconnect layer 332, and via 1s (see FIG. 3C-3D: 322; but not shown in FIG. 3E) couple the metal1 layer 324, 330 to the metal2 layer 354.

Referring back to FIGS. 3A-3D, the SRAM cell layout 300 includes upper and lower cell edges 302, 304 and left and right cell edges 306, 308 corresponding to an outer perimeter of the SRAM cell. In the illustrated embodiment, the outer perimeter is a rectangle and the left and right cell edges 306, 308 are parallel to one another and share a first length, $d_1$, and the upper and lower cell edges 302, 304 are parallel to one another and share a second length, $d_2$, that is greater than the first length, although other polygonal perimeters are also possible.

In FIG. 3A, fins (e.g., 342a, 342a) extend over a substrate in a first direction, and a gate layer (e.g., 340) traverses over the fins. The gate electrode 340, which can be made of doped polysilicon or metal for example, overlies at least one semiconductor fin 342 to establish each fin field effect transistor (FinFET). For some of the transistors, such as transistors M3 and M5, the gate electrode 340 overlies only a single fin; whereas for other transistors, such as transistors M1, M2, M4, and M6, the gate electrode 340 overlies a pair of semiconductor fins 342. Transistors M1, M2, M4, and M6 correspond to p-type fins, and have n-type source/drain regions on opposite sides of their gates; while transistors M3 and M5 correspond to n-type fins and have p-type source/drain regions on opposite sides of their gates. Because the first and second access transistors M1, M6 and transistors M2, M4 can have the same conductivity type (e.g., n-type finFETs), the transistors M1, M2, M4, and M6 are aligned in vertical "stripes". The other transistors M3, M5, which have a second conductivity type (e.g., p-type finFETs) and have only single fins, can correspond to a separate vertical strip between the stripes of M1, M2 and M4, M6. The source/drain regions can be doped regions of the fin in some embodiments, but are often epitaxially grown source/drain regions that exhibit a diamond-shaped cross-sectional profile.

FIG. 3B illustrates how the local interconnect layer can couple source/drain regions of a transistor together—for example, local interconnect line 332 extends over fins 342a and 342b and effectively couples source/drain regions on one side of fins 342a and 342b to one another. First contact 352 extends downwardly from metal 1 layer 330 to local interconnect layer 332 to couple fins 342a, 342b to BL', while second contact 326 extends downwardly from metal 1 layer 324 to gate 340. (See also FIG. 3E, which shows a corresponding perspective view of these layers for transistor M6.) Wide or elongated contacts 360, 362, which have a rectangular or oval shape rather than a square or circular shape as viewed from above, couple gates to local interconnect. For example, first wide or elongated contact 360 couples local interconnect and source/drains of M1 and M2 to gate of M5, and second wide or elongated contact 362 couples local interconnect and source/drains of M4 and M6 to gate of M3.

As further shown in FIG. 3B, a first power rail 310 lies along (and in parallel with) the left cell edge 306 and/or right cell edge 308. The first power rail 310 is configured to couple the SRAM cell layout 300 to a first DC power supply, such as VSS for example. A second power rail 312 extends in parallel with the first power rail 310, and extends along a midline 314 of the SRAM cell layout 300. Thus, the second power rail 312 is arranged equidistantly between the left and right cell edges 306, 308. The second power rail 312 is configured to couple the SRAM cell layout 300 to a second DC power supply, such as VDD for example.

Figure 6:
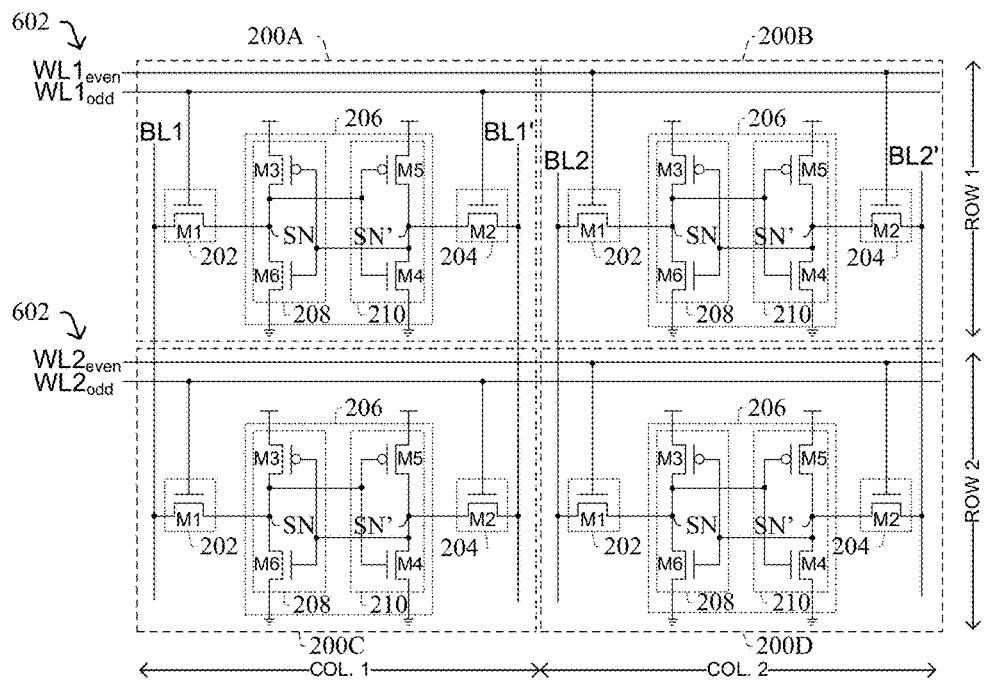
FIG. 6 illustrates some embodiments of a schematic diagram of a portion of an SRAM array in accordance with some embodiments.
Figure 7:
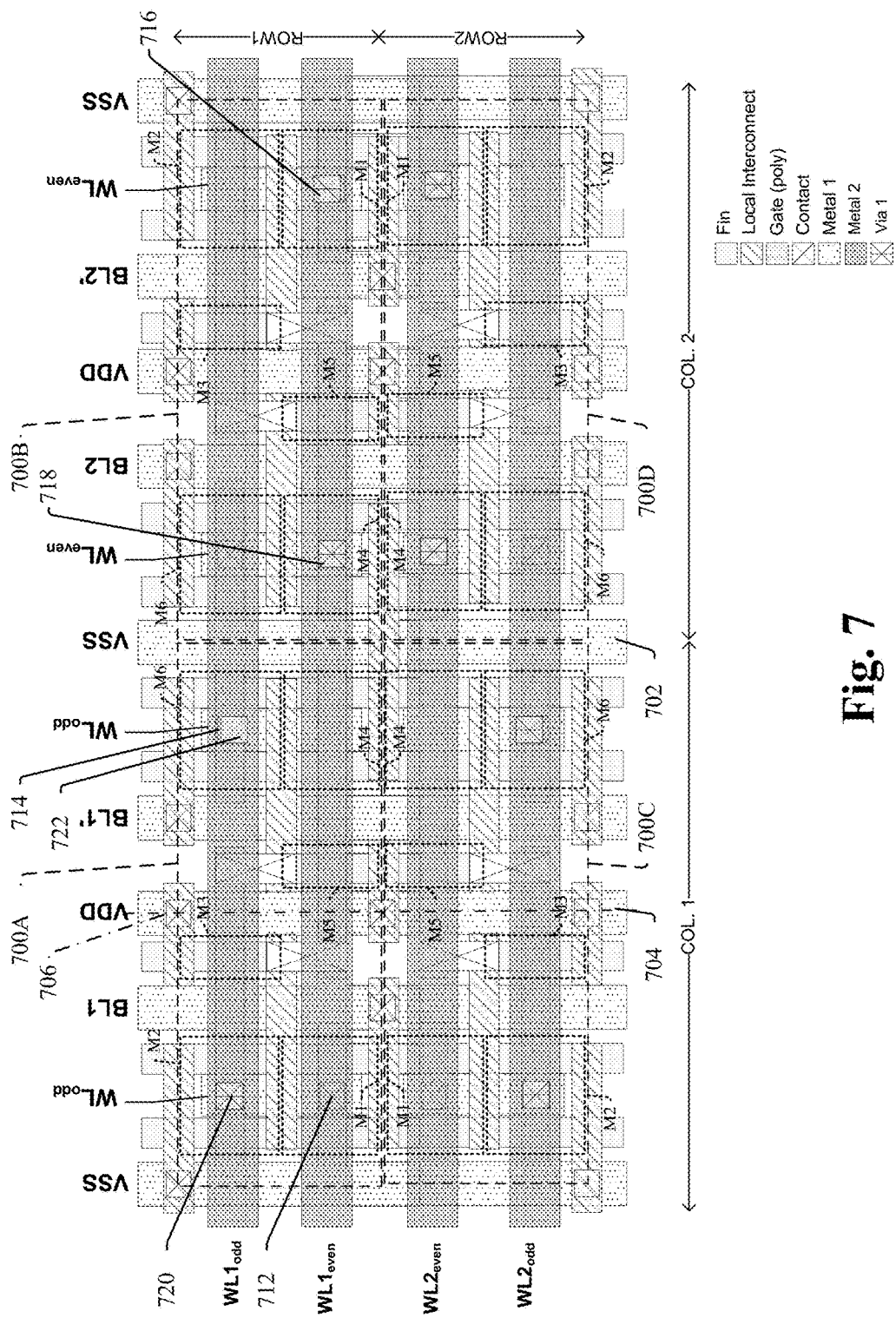
FIG. 7 illustrates some embodiments of a layout view consistent with some examples of FIG. 6.

In FIG. 3C, two wordlines $WL_{odd}$, $WL_{even}$ extend in parallel with the upper and lower cell edges 302, 304 over the SRAM cell and extend perpendicular to the first and second power rails 310, 312. Only one of the two wordlines (e.g., $WL_{odd}$) is coupled to gates of respective access transistors M1, M6 of the SRAM cell, while the other of the two wordlines (e.g., $WL_{even}$) is coupled to gates of respective access transistors of neighboring cells (not shown in FIG. 3A-3D, but see FIGS. 6-7 illustrating this point as described further herein).

In FIG. 3D's embodiment, for example, the upper wordline, which is labeled as $WL_{odd}$ for example, is shown as being coupled to the gate of first access transistor M1 through a via 1 (316), a metal 1 line (318), and a contact (320). The upper wordline, which is labeled as $WL_{odd}$ as an example, is also shown as being coupled to the gate of second access transistor M6 through a via 1 (322), a metal 1 line (324), and a contact (326), wherein the via 1 (322) and contact (326) are aligned directly over one another. The lower wordline, which is labeled as $WL_{even}$ for this example, extends over the SRAM cell layout 300 without being coupled to access transistors M1, M6.

In FIG. 3D, a first plurality of metal lines, which include the first and second power rails 310, 312 and can be metal1 lines, extend in parallel with one another over the SRAM cell layout 300. An order of the first plurality of metal lines moving from the left cell edge 306 to the right cell edge 308 (or from the right cell edge 308 to left cell edge 306) is the first power rail 310, a first of the two wordlines WL 318, a bitline BL 328, the second power rail 312, a complementary bitline BL' 330, a second of the two wordlines WL 324, and optional first power rail 310. The rightmost or leftmost first power rail 310 in FIG. 3D is optional as it may be included in the next adjacent SRAM cell (not shown, but to the left or right of SRAM cell layout 300), such that neighboring SRAM cells fit together in a tile-like fashion without the first power rails 310 being redundant and/or overlapping.

In FIG. 3D, a second plurality of metal lines extend in parallel with one another and in parallel with the upper cell edge 302 and lower cell edge 304 of the SRAM cell layout 300. An order of the second plurality of metal lines moving from the upper cell edge 302 to the lower cell edge 304 (or from the lower cell edge 304 to the upper cell edge 302) is a first local interconnect line 332 a first of the two interleaved wordlines, $WL_{odd}$, a second local interconnect line 334, a second of the two interleaved wordlines, $WL_{even}$, and a third local interconnect line 336. Like the first power rail 310, the uppermost or lowermost local interconnect line 332/336 and corresponding contacts in FIG. 3A are optional in SRAM cell 300 as they may be included in the next adjacent SRAM cell (not shown, but above or below SRAM cell layout 300), such that neighboring SRAM cells fit together in a tile-like fashion without the local interconnect lines being redundant and/or overlapping.

FIG. 3E shows a perspective view of second access transistor M6 in accordance with some embodiments. The second access transistor M6 includes a pair of semiconductor fins 342 running parallel to one another over a semiconductor substrate 346. The fins 342 extend upwardly from the semiconductor substrate 346 through openings in an isolation region 348, such as a silicon dioxide or low-k dielectric layer (e.g., buried oxide (BOX) layer). A conductive gate electrode 340 straddles both semiconductor fins 342, and a gate dielectric 350, such as a $SiO_2$ or high-k dielectric, separates the gate electrode 340 from the semiconductor fins 342. Contact 326 couples the gate electrode 340 to a metal 1 layer 324. Local interconnect layer from FIG. 3A has been omitted for clarity in FIG. 3D, but as can be seen from FIG. 3A a first local interconnect line shorts a first set of source/drain regions in the fins 342 on one side of the gate electrode 340 to one another; and a second interconnect line shorts a second set of source/drain regions in the fins 342 on the other side of the gate electrode 340 to one another, such that the fins 342 act as a single finFET rather than two finFETs.

Figure 4:
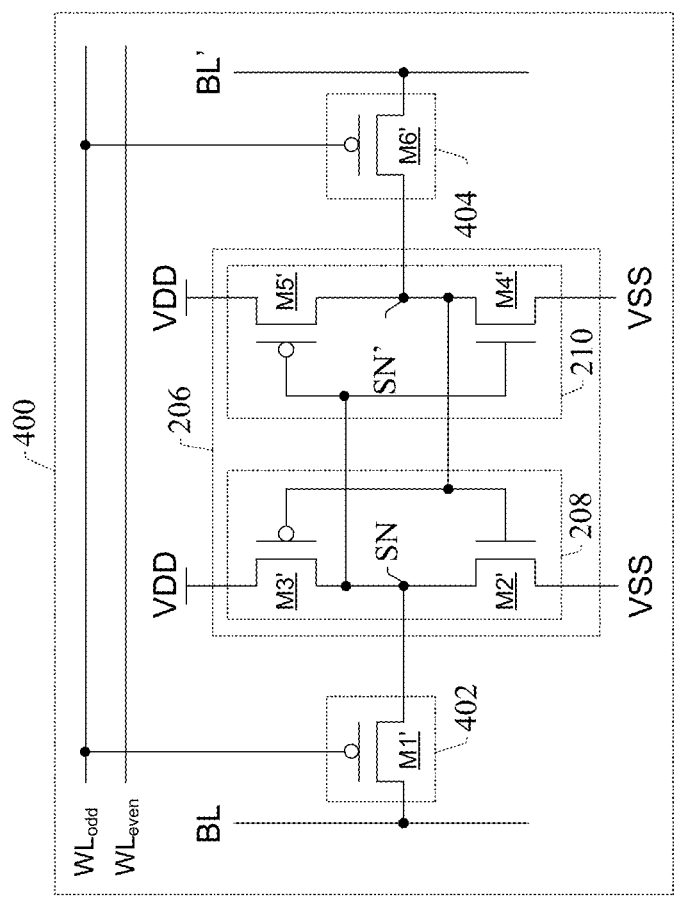
FIG. 4 illustrates some alternative embodiments of a schematic diagram of an SRAM access transistor in accordance with some embodiments.

FIG. 4 shows an alternate embodiment of an SRAM cell 400 wherein the access transistors M1, M6 are PMOS transistors 402, 404 rather than the NMOS transistors previously illustrated in FIG. 2. Thus, FIG. 4's SRAM cell 400 includes transistors M1', M2', M3', M4', M5', and M6'.

Figure 5:
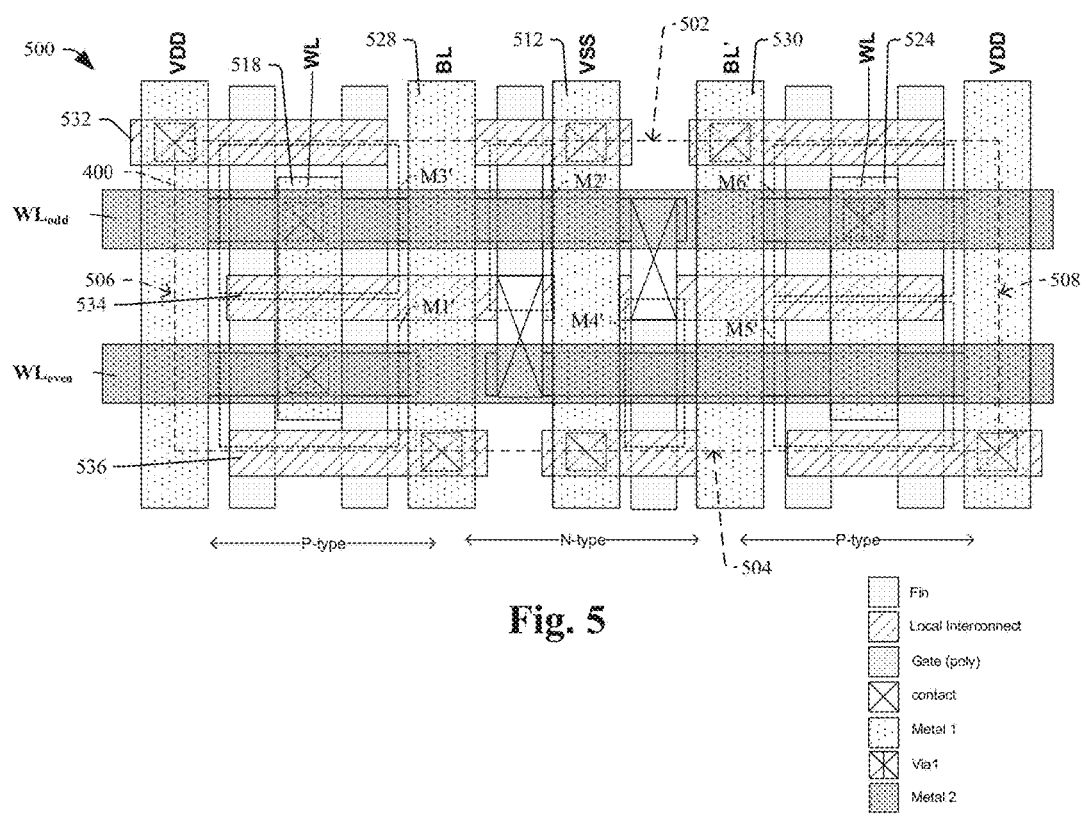
FIG. 5 illustrates some embodiments of a layout view of an SRAM cell having interleaved wordlines consistent with some examples of FIG. 4.

FIG. 5 shows an SRAM cell layout 500 consistent with FIG. 4's embodiment. Transistors M1', M2', M3', M4', M5', and M6' are labeled to be consistent for FIGS. 4-5. Relative to FIG. 3D's layout, FIG. 5's layout is the same except that the position of the VDD and VSS power rails is "flipped", and the locations of the n-type and p-type fins are altered so access transistors M1', M6' and transistors M3', M5' are p-type, while transistors M2', M4' are n-type. Thus, in FIG. 5, an order of the first plurality of metal lines moving from the left cell edge 506 to the right cell edge 508 (or from the right cell edge 508 to left cell edge 506) is VDD, a first of the two wordlines WL, a bitline BL, VSS, a complementary bitline BL', a second of the two wordlines WL, and optional VDD.

The SRAM cell layout 500 includes upper and lower cell edges 502, 504 and left and right cell edges 506, 508 corresponding to an outer perimeter of the SRAM cell. A VDD power rail 510 lies along (and in parallel with) the left cell edge 506 and/or right cell edge 508. A VSS power rail 512 extends in parallel with the VDD power rail 510, and extends along a midline 514 of the SRAM cell layout 500. Thus, the VSS power rail 512 is arranged equidistantly between the left and right cell edges 506, 508.

Two wordlines $WL_{odd}$, $WL_{even}$ extend in parallel with the upper and lower cell edges 502, 504 over the SRAM cell and extend perpendicular to the VDD and VSS power rails 510, 512. Only one of the two wordlines (e.g., $WL_{odd}$) is coupled to gates of respective access transistors M1', M6' of the SRAM cell, while the other of the two wordlines (e.g., $WL_{even}$) is coupled to gates of respective access transistors of neighboring cells.

A first plurality of metal lines, which include the VDD and VSS power rails 510, 512 and are formed in metal 1, extend in parallel with one another over the SRAM cell layout 500. An order of the first plurality of metal lines moving from the left cell edge 506 to the right cell edge 508 (or from the right cell edge 508 to left cell edge 506) is the VDD power rail 510, a first of the two wordlines WL 518, a bitline BL 528, the VSS power rail 512, a complementary bitline BL' 530, a second of the two wordlines WL 524, and optional VDD power rail 510. The rightmost or leftmost VDD power rail 510 in FIG. 5 is optional as it may be included in the next adjacent SRAM cell (not shown, but to the left or right of SRAM cell layout 500), such that neighboring SRAM cells fit together in a tile-like fashion without the VDD power rails 510 being redundant and/or overlapping.

A second plurality of metal lines extend in parallel with one another and in parallel with the upper cell edge 502 and lower cell edge 504 of the SRAM cell layout 500. An order of the second plurality of metal lines moving from the upper cell edge 502 to the lower cell edge 504 (or from the lower cell edge 504 to the upper cell edge 502) is a first local interconnect line 532, a first of the two interleaved wordlines $WL_{odd}$, a second local interconnect line 534, a second of the two interleaved wordlines $WL_{even}$, and a third local interconnect line 536. Like the VDD power rail 510, the uppermost or lowermost local interconnect line 532/536 and corresponding contacts in FIG. 5 are optional in SRAM cell 500 as they may be included in the next adjacent SRAM cell (not shown, but above or below SRAM cell layout 500), such that neighboring SRAM cells fit together in a tile-like fashion without the local interconnect lines being redundant and/or overlapping.

FIG. 6 shows a transistor-level schematic of a portion of an SRAM array that includes four SRAM cells 200A, 200B, 200C, 200D. Each SRAM cell can be as previously described with regards to FIG. 2 or FIG. 4, and the cells 200A-200D are arranged in a plurality of rows and a plurality of columns. For purposes of this example, a first row (Row1) and a second row (Row2) as well as a first column (Col.1) and a second column (Col.2) are illustrated. A pair of interleaved wordlines 602 extend over each row of memory cells, and a pair of complementary bitlines extend over each column. For example, $WL1_{even}$, $WL1_{odd}$ extend over Row 1; and BL1, BL1' extend over Column 1.

FIG. 7 shows a layout view of an SRAM array consistent with FIG. 6's schematic. Like FIG. 6, a first row and a second row as well as a first column and a second column are illustrated. Thus, FIG. 7 depicts four SRAM cells 700A, 700B, 700C, 700D, which are "tiled" together according to some embodiments. Each SRAM cell 700A-700D has a layout, as previously described with respect to FIGS. 3A-3E, for example. The SRAM cells are circumscribed by respective SRAM cell perimeters which abut one another. A second SRAM cell 700B is flipped horizontally with regards to a first SRAM cell 700A, a third SRAM cell 700C is flipped vertically with regards to the first SRAM cell 700A, and a fourth SRAM cell 700D is flipped horizontally and vertically with regards to the first SRAM cell 700A.

A first power rail 702, such as a VSS rail, extends vertically along a first column of SRAM cells. The first power rail 702 abuts right edges of SRAM cells along the first column and left edges of SRAM cells along the second column. Two interleaved wordlines extend horizontally along each row of SRAM cells. The wordlines reside between upper and lower edges of the SRAM cell perimeters for the row. A first of the two wordlines is coupled to gates of access transistors for SRAM cells in even columns of the row, and a second of the two wordlines is coupled to gates of access transistors for SRAM cells in odd columns of the row. For example, $WL1_{odd}$ and $WL1_{even}$ extend over Row 1, with $WL1_{odd}$ being coupled to access transistors of odd columns and $WL1_{even}$ being couple to access transistors of even columns.

A second power rail 704 extends vertically along the first column of SRAM cells and is disposed along a mid-line 706 of the first column. The second power rail 704 is configured to carry a different DC voltage than the first power rail 702. For example, the first power rail 702 can be a VSS rail and the second power rail 704 can be a VDD rail, or vice versa, depending on the implementation.

The first SRAM cell 700A, which is located at an intersection of the first column and the first row, includes a first wordline contact 712 to a first side of the mid-line 706 and a second wordline contact 714 to a second side of the mid-line 706. The first wordline contact 712, along with a first via 1 720, couple the first of the two wordlines $WL1_{odd}$ to a first access transistor M1 of the first SRAM cell 700A. The second wordline contact 714, along with a second via 1 722, couple the first of the two wordlines $WL1_{odd}$ to a second access transistor M6 of the first SRAM cell.

The second SRAM cell 700B, which is located at an intersection of the second column and the first row, includes a third wordline contact 716 and a fourth wordline via 718, which are on opposite sides of a mid-line of the second column. The third wordline contact 716 couples the second of the two wordlines $WL1_{even}$ to a first access transistor M1 of the second SRAM cell 700B. The fourth wordline contact couples the second of the two wordlines $WL1_{even}$ to a second access transistor M6 of the second SRAM cell.

The first and second SRAM cells 700A, 700B are mirror images of one another about the first power rail 702, except that first and second wordline contacts 712, 714 lie on a first line which is offset vertically by a distance from a second line on which the third and fourth wordline contacts 716, 718 lie. The third and fourth SRAM cells 700C, 700D are flipped vertically with respect to the first and second SRAM cells 700A, 700B.

Figure 8:
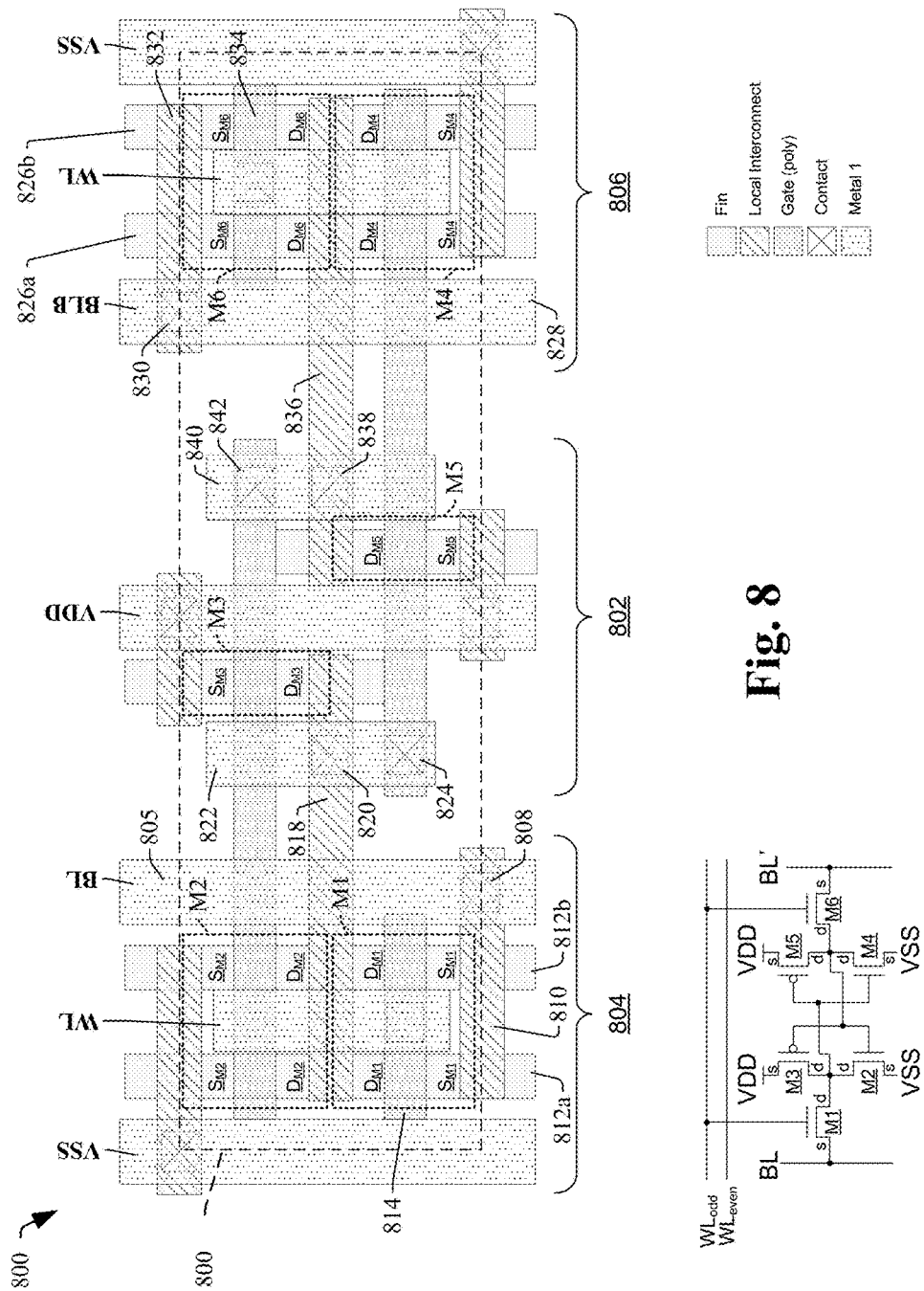
FIG. 8 illustrates some alternate embodiments of a layout view of an SRAM cell having interleaved wordlines in accordance with some embodiments.

FIG. 8 shows another alternative SRAM cell layout 800 corresponding to the FIG. 2's transistor schematic diagram 200, which is reproduced in the lower left corner of FIG. 8 for convenience. Relative to FIG. 3B, only a middle section of the layout 802 (which corresponds to transistors M3, M5) has changed, and the edge portions 804, 806 of the layout corresponding to transistors M1, M2, M4, M6 remains the same as in FIG. 3B. Instead of wide or elongated contacts (FIG. 3B: 360, 362), metal 1 is now used for the cross-coupled inverters. Thus, the middle section 802 in FIG. 8 has been "spaced apart" from the outer edge portions 804, 806, and the positions of contacts has changed, but the schematic connections are the same as FIG. 2.

In FIG. 8, BL is coupled to fins 812*a*, 812*b*, which act as a source region $S_{M1}$ of transistor M1, through metal1 line 805, contact 808, and local interconnect line 810. Fins 812*a*, 812*b* of transistor M1 extend under gate 814 of M1. Drain region $D_{M1}$ is coupled to drain region $D_{M2}$ of transistor M2 though fins 812*a*, 812*b*. Drain region $D_{M1}$ is also coupled to gates of transistors M4, M5 through local interconnect segment 818, contact 820, metal1 line 822, and contact 824. On the other side of the layout 800, BLB is coupled to fins 826*a*, 826*b*, which act as a source region $S_{M6}$ of transistor M6, through metal1 line 828, contact 830, and local interconnect line 832. Fins 826*a*, 826*b* of transistor M6 extend under gate 834 of M6. Drain region $D_{M6}$ is coupled to drain region $D_{M4}$ of transistor M4. Drain region $D_{M6}$ is also coupled to gates of transistors M2, M3 through local interconnect segment 836, contact 838, metal1 line 840, and contact 842.

Figure 9A:
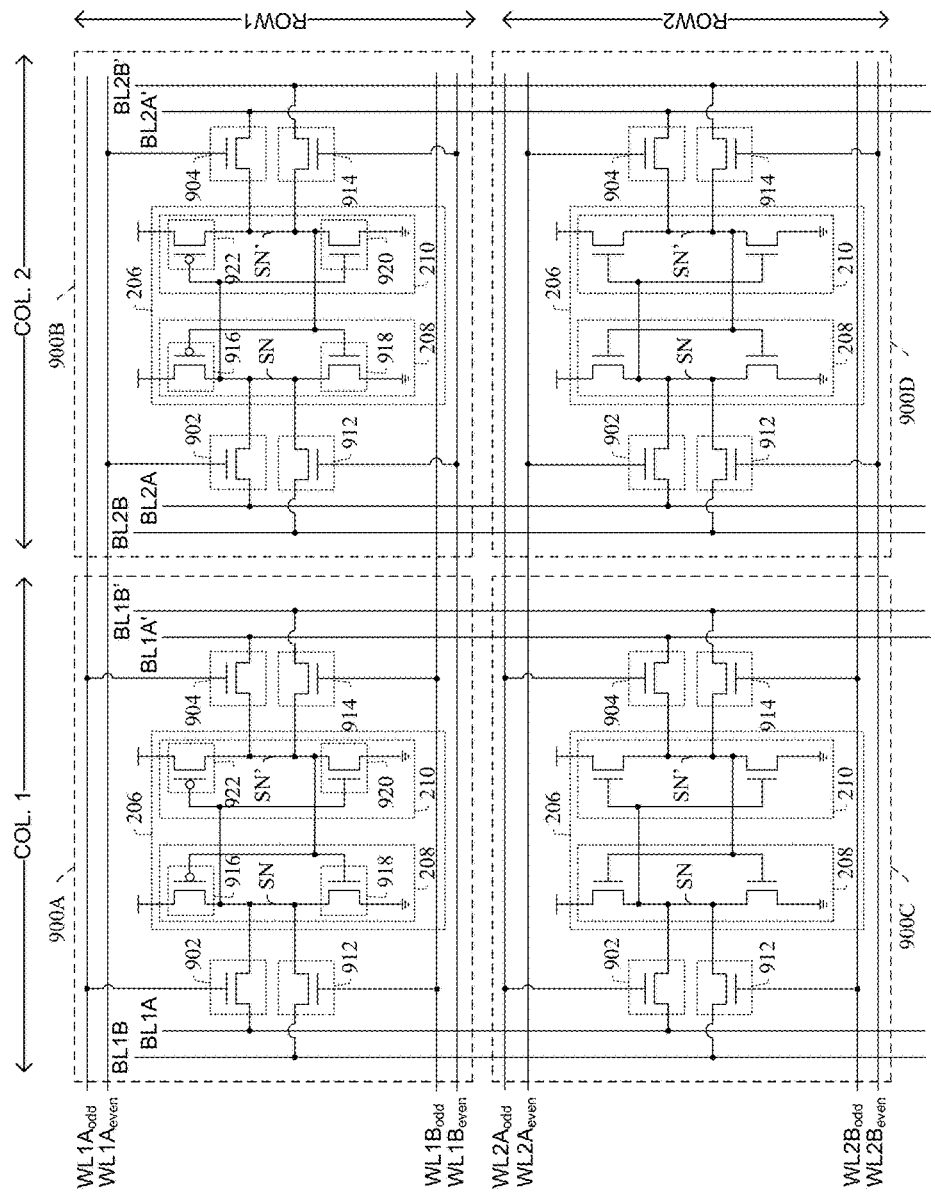
FIG. 9A illustrates some embodiments of a transistor level schematic view of an SRAM array having interleaved wordlines in accordance with some embodiments.

FIG. 9A illustrates another embodiment of a transistor-level schematic of a portion of an SRAM array in accordance with some embodiments. The portion of the illustrated SRAM array includes four SRAM cells 900A, 900B, 900C, 900D arranged in first and second rows (Row1, Row2) and first and second columns (Col.1, Col.2), although arrays in general can include any number of rows and columns. In this example, each SRAM cell is a dual-port SRAM cell that includes four access transistors 902, 904, 912, 914, which selectively allow access to complementary storage nodes SN, SN' of the SRAM cell. For each row, four interleaved wordlines are coupled to SRAM memory cells of the row. A first pair of these interleaved wordlines are coupled to access transistors along odd columns, while a second pair of these interleaved wordlines are coupled to access transistors along even columns. For clarity, eight transistors in each cell are labeled as follows: 902, 904, 912, 914, 916, 918, 920, and 922.

For example, the memory cell 900A located at the intersection of Row1 and Col. 1 includes a first port (Port A) accessible through a first pair of access transistors (902, 904) and a port (Port B) accessible through a second pair of access transistors (912, 914). The first pair of access transistors (902, 904) is configured to selectively couple the complementary data storage nodes SN, SN' to a first pair of complementary bitlines (BL1A, BL1A'), respectively. The second pair of access transistors (912, 914) is configured to selectively couple the complementary data storage nodes SN, SN' to a second pair of complementary bitlines BL1B, BL1B', respectively.

A first access transistor 902 of the first pair of access transistors has a source coupled to a first storage node SN of the SRAM cell, a drain coupled to a first bitline BL1A of the first pair of complementary bitlines, and a gate coupled to a first of the first pair of wordlines $WL1A_{odd}$. A second access transistor 904 of the first pair of access transistors has a source coupled to a first complementary storage node SN' of the SRAM cell, a drain coupled to a second bitline BL1A' of the first pair of complementary bitlines, and a gate coupled to the first of the first pair of wordlines $WL1A_{odd}$.

A first access transistor 912 of the second pair of access transistors has a source coupled to the first storage node SN of the SRAM cell, a drain coupled to a first bitline BL1B of the second pair of complementary bitlines, and a gate coupled to a first $WL1B_{odd}$ of the second pair of wordlines. A second access transistor 914 of the second pair of access transistors has a source coupled to the first complementary storage node SN' of the SRAM cell, a drain coupled to a second bitline BL1B' of the second pair of complementary bitlines, and a gate coupled to the first $WL1B_{odd}$ of the second pair of wordlines.

Thus, the first and second pairs of complementary bitlines for each column can carry different biases that allow the array to be programmed with different states depending on which pair of interleaved wordlines are asserted. For example, BL1A, BL1A' can be biased with startup biases used only for resetting an initial state of SRAM array, while BL1B, BL1B' can be used to write data that changes over time to reflect application data, conditions measured in real-time, etc.

Figure 9B:
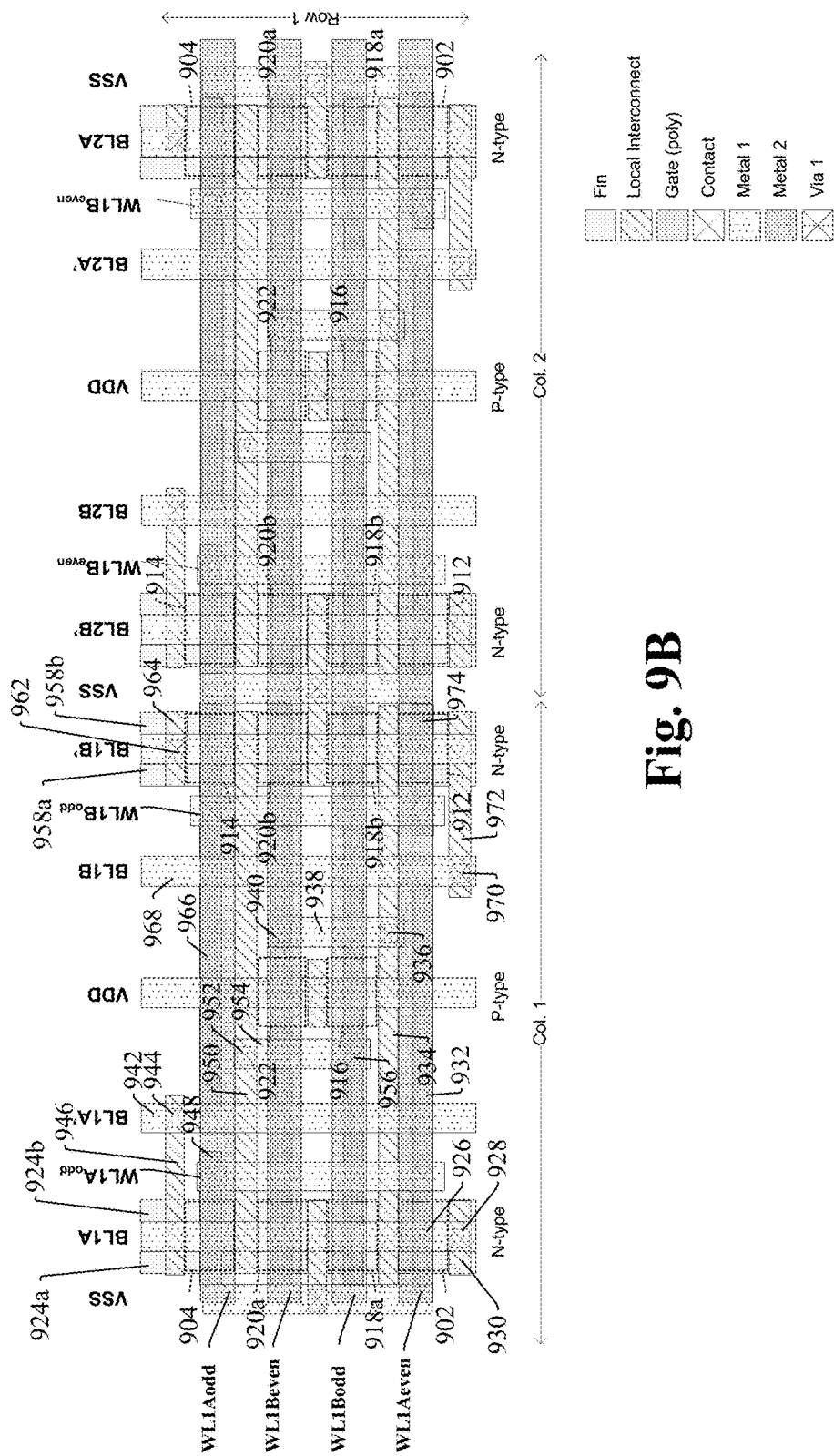
FIG. 9B illustrates some embodiments of a layout view of a portion of an SRAM array having interleaved wordlines consistent with some examples of FIG. 9A.

FIG. 9B illustrates a sample layout in accordance with some embodiments of FIG. 9A's schematic. FIG. 9B's layout illustrates a single row (Row1) with two columns (Col. 1, Col. 2), but it will be appreciated that the layout can be extended to any number of rows and any number of columns. Like FIG. 9A, four wordlines ($WL1A_{odd}$, $WL1B_{even}$, $WL1B_{odd}$, $WL1A_{even}$) are shown in metal 2 extending horizontally and continuously across the illustrated row. The eight transistors of FIG. 9A (transistors 902, 904, 912, 914, 916, 918, 920, and 922) are illustrated for each cell in FIG. 9B. Notably, two of the transistors 918, 920 previously illustrated in FIG. 9A are each established in FIG. 9B's layout by a pair of transistors. In particular, transistor 918 in FIG. 9A is implemented as transistors 918*a*, 918*b* in FIG. 9B, and transistor 920 in FIG. 9A is implemented as transistors 920*a*, 920*b* in FIG. 9B.

In FIG. 9B, BL1A is coupled to fins 924*a*, 924*b*, which act as a source region of transistor 902, through metal1 line 926, contact 928, and local interconnect line 930. Fins 924*a*, 924*b* of transistor 902 extend under gate 932 of transistor 902. Drain of transistor 902 is coupled to drain of transistor 918*a* through fins 924*a*, 924*b*. Drain of transistor 902 is also coupled to gate of transistor 922 through local interconnect segment 934, contact 936, metal1 line 938, and contact 940.

BL1A' is coupled to fins 924*a*, 924*b*, which act as a source region of transistor 904, through metal1 line 942, contact 944, and local interconnect line 946. Fins 924*a*, 924*b* of transistor 904 extend under gate 948 of transistor 904. Drain of transistor 904 is coupled to drain of transistor 920*a* through fins 924*a*, 924*b*. Drain of transistor 904 is also coupled to gate of transistor 916 through local interconnect segment 950, contact 952, metal1 line 954, and contact 956.

BL1B is coupled to fins 958*a*, 958*b*, which act as a source region of transistor 912, through metal1 line 968, contact 970, and local interconnect line 972. Fins 958*a*, 958*b* of transistor 912 extend under gate 974 of transistor 912. Drain of transistor 912 is coupled to drain of transistor 918*b* though fins 958*a*, 958*b*. Drain of transistor 912 is also coupled to gate of transistor 922 through local interconnect segment 934, contact 936, metal1 line 938, and contact 940.

BL1 B' is coupled to fins 958*a*, 958*b*, which act as a source region of transistor 914, through metal1 line 960, contact 962, and local interconnect line 964. Fins 958*a*, 958*b* of transistor 914 extend under gate 966 of transistor 914. Drain of transistor 914 is coupled to drain of transistor 920*b* though fins 958*a*, 958*b*. Drain of transistor 914 is also coupled to gate of transistor 922 through local interconnect segment 950, contact 952, metal1 line 954, and contact 956.

In some embodiments, the semiconductor substrate on which the IC is disposed can be a bulk silicon substrate or a semiconductor-on-insulator (SOI) substrate (e.g., silicon on insulator substrate). The substrate can also be a binary semiconductor substrate (e.g., GaAs), a tertiary semiconductor substrate (e.g., AlGaAs), or a higher order semiconductor substrate, for example. In many instances, the substrate manifests as a semiconductor wafer during manufacturing, and can have a diameter of 1-inch (25 mm); 2-inch (51 mm); 3-inch (76 mm); fl-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. After manufacturing is completed, such a wafer can optionally be stacked with other wafers or die, and is then singulated into individual die which correspond to individual ICs.

Thus, some embodiments of the present disclosure relate to a static random access memory (SRAM) cell laid out on a semiconductor substrate according to an SRAM cell layout. The SRAM cell layout includes upper and lower cell edges and left and right cell edges corresponding to an outer perimeter of the SRAM cell on the semiconductor substrate. A first power rail extends in parallel with and lies along the left edge or the right cell edge. The first power rail is configured to couple the SRAM cell to a first DC power supply. A second power rail extends in parallel with the first power rail and along a midline of the SRAM cell. The second power rail is arranged equidistantly between the left and right cell edges and the second power rail is configured to couple the SRAM cell to a second DC power supply. The second DC power supply differs from the first DC power supply. Two wordlines extend in parallel with the upper and lower cell edges over the SRAM cell, and extend perpendicular to the first and second power rails. Only one of the two wordlines is coupled to gates of respective access transistors of the SRAM cell.

In other embodiments, the present disclosure relates to a static random access memory (SRAM) array laid out on a semiconductor substrate according to an SRAM array layout. The SRAM array layout includes a plurality of SRAM cells which are circumscribed by respective SRAM cell perimeters. The plurality of SRAM cells are arranged in a plurality of rows and a plurality of columns such that neighboring SRAM cell perimeters abut one another. A first power rail extends vertically along a first column of SRAM cells and abuts right edges of SRAM cells along a first column and left edges of SRAM cells along a second column that neighbors the first column. Two wordlines extend horizontally along a row of SRAM cells and resides between upper and lower edges of the SRAM cell perimeters for the row. A first of the two wordlines is coupled to gates of access transistors for SRAM cells in even columns of the row, and a second of the two wordlines is coupled to gates of access transistors for SRAM cells in odd columns of the row.

In still other embodiments, the present disclosure relates to a static random access memory (SRAM) device. The SRAM device includes a plurality of SRAM cells arranged in a plurality of rows and a plurality of columns, wherein respective SRAM cells include respective pairs of complementary data storage nodes to store respective data states. A first pair of access transistors is coupled to the complementary data storage nodes of an SRAM cell and is configured to selectively couple the complementary data storage nodes to a first pair of complementary bitlines, respectively. A second pair of access transistors is coupled to the complementary data storage nodes of the SRAM cell and is configured to selectively couple the complementary data storage nodes to a second pair of complementary bitlines, respectively.

It will be appreciated that in this written description, as well as in the claims below, the terms "first", "second", "third" etc. are merely generic identifiers used for ease of description to distinguish between different elements of a figure or a series of figures. In and of themselves, these terms do not imply any temporal ordering or structural proximity for these elements, and are not intended to be descriptive of corresponding elements in different illustrated embodiments and/or un-illustrated embodiments. For example, "a first column" described in connection with a first figure may (or may not) correspond to a "first column" described in connection with a second figure (e.g., or may even correspond to a "second column" in the second figure), and may (or may not) correspond to a "first column" in an un-illustrated embodiment. Further, because a left-most cell in a row can be thought of as the zeroth cell or the first cell of the row, the terms "even" and "odd" can be transposed depending on the arbitrary convention assigned to the first cell of the row.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A static random access memory (SRAM) cell laid out on a semiconductor substrate according to an SRAM cell layout, the SRAM cell layout comprising:
   upper and lower cell edges and left and right cell edges corresponding to an outer perimeter of the SRAM cell on the semiconductor substrate;
   a first power rail extending in parallel with and lying along the left cell edge or the right cell edge, wherein the first power rail is configured to couple the SRAM cell to a first power supply;
   a second power rail extending in parallel with the first power rail and along a midline of the SRAM cell, wherein the second power rail is arranged symmetrically between the left and right cell edges and the second power rail is configured to couple the SRAM cell to a second power supply, the second power supply differing from the first power supply;
   two wordlines extending in parallel with the upper and lower cell edges over the SRAM cell and extending perpendicular to the first and second power rails, wherein only one of the two wordlines is coupled to gates of respective access transistors of the SRAM cell;
   a first bitline extending in parallel with the first power rail and the second power rail and arranged to a first side of the second power rail; and
   a second bitline, which is complementary to the first bitline, extending in parallel with the first power rail and the second power rail and arranged to a second side of the second power rail, the second side being opposite the first side.

2. The SRAM cell of claim 1, wherein the outer perimeter is a rectangle and the left and right cell edges are parallel to one another and share a first length, and the upper and lower cell edges are parallel to one another and share a second length that is greater than the first length.

3. The SRAM cell of claim 1, wherein a plurality of metal lines including the first and second power rails extend in parallel with one another and an order of the metal lines moving from the left cell edge to the right cell edge or from the right cell edge to left cell edge is the first power rail, a first of the two wordlines, a bitline, the second power rail, a complementary bitline, and a second of the two wordlines.

4. The SRAM cell of claim 1, wherein the first power rail is configured to carry a VDD signal and the second power rail is configured to carry a VSS signal.

5. The SRAM cell of claim 1, wherein the second power rail is configured to carry a VDD signal and the first power rail is configured to carry a VSS signal.

6. The SRAM cell of claim 1:
wherein an SRAM cell includes first and second access transistors and a pair of cross-coupled inverters, wherein the first and second access transistors allow selective access to complementary storage nodes of the pair of cross-coupled inverters; and
wherein the first and second access transistors each include a pair of semiconductor fins running parallel to one another and a conductive gate electrode that straddles both semiconductor fins of the pair of semiconductor fins.

7. The SRAM cell of claim 6, wherein the first and second access transistors have a first conductivity type, and wherein transistors of the pair of cross-coupled inverters having the first conductivity type each include a pair of semiconductor fins running parallel to one another and a conductive gate electrode that straddles both semiconductor fins of the pair of semiconductor fins; and
wherein transistors of the pair of cross-coupled inverters having a second conductivity type, which is opposite the first conductivity type are each made up of a single fin and a conductive gate electrode that straddles the single fin.

8. A static random access memory (SRAM) array laid out on a semiconductor substrate according to an SRAM array layout, the SRAM array layout comprising:
a plurality of SRAM cells which are circumscribed by respective SRAM cell perimeters, wherein the plurality of SRAM cells are arranged in a plurality of rows and a plurality of columns such that neighboring SRAM cell perimeters abut one another;
a first power rail extending vertically along a first column of SRAM cells and abutting right edges of SRAM cells along a first column and left edges of SRAM cells along a second column that neighbors the first column;
a second power rail extending vertically along a centerline of the first column of SRAM cells; and
two wordlines extending horizontally along a row of SRAM cells and residing between upper and lower edges of the SRAM cell perimeters for the row, wherein a first of the two wordlines is coupled to gates of access transistors for SRAM cells in even columns of the row and a second of the two wordlines is coupled to gates of access transistors for SRAM cells in odd columns of the row;
wherein a first of the two wordlines is coupled to a first metal line segment which extends vertically along the first column and which is arranged to a first side of the second power rail, and wherein the first of the two wordlines is further coupled to a second metal line segment which extends vertically along the first column and which is arranged to a second side of the second power rail, the second side being opposite the first side.

9. The SRAM array layout of claim 8, further comprising:
a second power rail extending vertically along the first column of SRAM cells and disposed along a mid-line of the first column, the second power rail configured to carry a different DC voltage than the first power rail.

10. The SRAM array layout of claim 9, wherein a first SRAM cell located at an intersection of the first column and the row comprises:
a first wordline contact to a first side of the mid-line and coupling the first of the two wordlines to a first access transistor of the first SRAM cell; and
a second wordline contact to a second side of the mid-line and coupling the first of the two wordlines to a second access transistor of the first SRAM cell.

11. The SRAM array layout of claim 10, wherein a second SRAM cell located at an intersection of the second column and the row comprises:
a third wordline contact to a first side of a mid-line of the second column, the third wordline contact coupling the second of the two wordlines to a first access transistor of the second SRAM cell; and
a fourth wordline contact to a second side of the mid-line of the second column, the fourth wordline contact coupling the second of the two wordlines to a second access transistor of the second SRAM cell.

12. The SRAM array layout of claim 11, wherein the first and second SRAM cells are mirror images of one another about the first power rail, except that first and second wordline contacts lie on a first line which is offset vertically by a distance from a second line on which the third and fourth wordline contacts lie.

13. The SRAM array layout of claim 9, wherein a plurality of metal lines including the first and second power rails extend in parallel with one another over the first column and an order of the metal lines moving from a left edge of the first column to a right edge of the first column or from the right edge of the first column to the left edge of the first column is the first of the two wordlines, a bitline, the second power rail, a complementary bitline, the second of the two wordlines, and the first power rail.

14. The SRAM array layout of claim 13, wherein the second power rail is configured to carry a VSS signal and the first power rail is configured to carry a VDD signal.

15. The SRAM array layout of claim 8:
wherein an SRAM cell includes first and second access transistors and a pair of cross-coupled inverters, wherein the first and second access transistors allow selective access to complementary storage nodes of the pair of cross-coupled inverters; and
wherein the first and second access transistors each include a pair of semiconductor fins running parallel to one another and a conductive gate electrode that straddles both semiconductor fins of the pair of semiconductor fins.

16. The SRAM array layout of claim 15, wherein the first and second access transistors have a first conductivity type, and wherein transistors of the pair of cross-coupled inverters having the first conductivity type each include a pair of semiconductor fins running parallel to one another and a conductive gate electrode that straddles both semiconductor fins of the pair of semiconductor fins; and
wherein transistors of the pair of cross-coupled inverters having a second conductivity type, which is opposite the first conductivity type are each made up of a single fin and a conductive gate electrode that straddles the single fin.

17. A static random access memory (SRAM) cell laid out on a semiconductor substrate according to an SRAM cell layout, the SRAM cell layout comprising:
- upper and lower cell edges and left and right cell edges corresponding to an outer perimeter of the SRAM cell on the semiconductor substrate;
- a first power rail disposed at a first height over the semiconductor substrate and extending in parallel with and lying along the left cell edge or the right cell edge;
- a second power rail disposed at the first height over the semiconductor substrate and extending in parallel with the first power rail and along a midline of the SRAM cell, wherein the second power rail is arranged along the midline of the SRAM cell to be equidistantly spaced between the left and right cell edges; and
- a single bitline segment disposed at the first height over the semiconductor substrate and extending in parallel with the first power rail and the second power rail, the single bitline segment being arranged between the first power rail and the second power rail.

18. The SRAM cell layout of claim 17, further comprising:
- a first wordline segment disposed at the first height over the semiconductor substrate and extending in parallel with the first power rail and the second power rail, the first wordline segment being arranged to a first side of the second power rail and being arranged between the first power rail and the single bitline.

19. The SRAM cell layout of claim 18, further comprising:
- a second wordline segment disposed at the first height over the semiconductor substrate and extending in parallel with the first power rail and the second power rail, the second wordline segment being arranged to a second side of the second power rail which is opposite the first side.

20. The SRAM cell layout of claim 19, further comprising:
- a first wordline disposed at a second height, which is greater than the first height, over the semiconductor substrate, the first wordline extending in parallel with the upper and lower cell edges over the SRAM cell and extending perpendicular to the first and second power rails, the first wordline being coupled to the first wordline segment through a first via and being coupled to the second wordline segment through a second via; and
- a second wordline disposed at the second height and extending in parallel with the first wordline, the second wordline being isolated from both the first wordline segment and the second wordline segment.

* * * * *